United States Patent [19]
Chew et al.

[11] Patent Number: 5,780,316
[45] Date of Patent: Jul. 14, 1998

[54] LINEWIDTH CONTROL APPARATUS AND METHOD

[75] Inventors: Hongzong Chew; John David Cuthbert; Hamlet Herring, all of Orlando, Fla.; John Louis Ryan, Hampton, N.J.; Robert Ching-I Sun, Orlando, Fla.; Thomas Michael Wolf, Laurys Station, Pa.; Daniel Mark Wroge, Orlando, Fla.

[73] Assignee: Lucent Technologies Inc., Murray Hill, N.J.

[21] Appl. No.: 879,109

[22] Filed: Jun. 19, 1997

Related U.S. Application Data

[63] Continuation of Ser. No. 557,800, Nov. 20, 1995, abandoned, which is a continuation of Ser. No. 251,051, May 31, 1994, abandoned.

[51] Int. Cl.$^6$ .................................................. H01L 21/00
[52] U.S. Cl. ................................................. 438/11; 438/18
[58] Field of Search ............................... 438/14, 18, 11; 257/48; 324/765

[56] References Cited

U.S. PATENT DOCUMENTS

| | | | |
|---|---|---|---|
| 3,974,443 | 8/1976 | Thomas | 324/716 |
| 4,024,561 | 5/1977 | Ghatalia . | |
| 4,319,396 | 3/1982 | Law et al. | 29/571 |
| 4,801,869 | 1/1989 | Sprogis | 324/765 |
| 4,918,377 | 4/1990 | Buehler et al. | 437/8 |
| 5,237,184 | 8/1993 | Yonemaru et al. | 257/202 |

FOREIGN PATENT DOCUMENTS 2 090 057  11/1981  United Kingdom .

OTHER PUBLICATIONS

Wolf et al., Silicon Processing for the VLSI Era, vol. 1, pp. 447–458, 1986.

Kerf Test Structure Designs for Process and Device Characterization C. Alcorn, D.Dworak, N. Haddad, W. Henley and P. Nixon vol. 28, No. 5, May 1985 Washington US. pp. 229–235. p. 231, col. 1, paragraph 5.

IBM Technical Disclosure Bulletin, vol. 23, No. 5, Oct. 1980 New York US, pp. 1963–1968, D. Basire Resistance and Dimension Characterization via Kerf Automatic In–Line Tests.

*Primary Examiner*—Brian Dutton
*Attorney, Agent, or Firm*—John T. Rehberg

[57] ABSTRACT

Linewidth control features having integral transistors are disclosed. Optical and electrical measurements of the linewidth control feature and its associated transistor may be correlated thereby providing a method of improving production processes.

2 Claims, 1 Drawing Sheet

LINEWIDTH CONTROL APPARATUS AND METHOD

This is a Continuation of application Ser. No. 08/557,800 filed Nov. 20, 1995, now abandoned, which is a continuation of application Ser. No. 08/251,051 filed May 31, 1994, abandoned.

TECHNICAL FIELD

This invention relates to the manufacture of integrated circuits.

BACKGROUND OF THE INVENTION

It is important in the manufacture of typical integrated circuits that the linewidth of etched features be measured and monitored closely to detect process irregularities which will ultimately lead to degraded circuit performance. Accordingly, designers, when planning various levels of an integrated circuit, frequently include linewidth test patterns in the spaces or "streets" between individual integrated circuits. For example, when, during a typical integrated circuit manufacturing process, gates are being formed within individual integrated circuits, additional features having the same width and material composition as the gates are formed in the streets between individual integrated circuits. These linewidth control features may be subsequently examined by, for example, optical means, to determine whether the gate forming process has worked properly. If, upon examination, the linewidth control features appear to have the proper width, it is inferred that the gates of individual integrated circuits (which were formed at the same time and by the same process as the linewidth control feature) have been properly formed. However, optical measurement of the linewidth control feature does not necessarily provide an indicator of the electrical performance (or even the electrical gate length) of gates within individual integrated circuits. Test transistors which may be formed separately and apart from linewidth control functions in streets of the wafer may or may not have an electrical gate length which corresponds to the linewidth control feature's measured optical dimensions. There exists a need for such correlated information.

SUMMARY OF THE INVENTION

The invention provides closely correlated information. Illustratively, the invention includes:
- a wafer having a plurality of partially formed integrated circuits having gates, the circuits being separated by streets;
- a linewidth control feature having three portions; the first and third portions being formed over thin oxide regions and the second portion being formed over a field oxide region. The third portion has adjacent source and drain regions and is capable of transistor operation, while the first and second portions do not have adjacent source and drain regions.

Another illustrative embodiment includes the method of forming a plurality of integrated circuits having gates and separated from each other by streets. At least one linewidth control feature of gate level polysilicon is formed in a street. The linewidth control feature has first, second and third portions; the first and thirds portions are formed over thin oxide and the second portion is formed over field oxide. Contacts are formed to the third portion of the linewidth control feature and to the source and drain.

Illustratively optical or SEM measurements of the first portion of the feature may be closely correlated.

DETAILED DESCRIPTION

Figure 1:
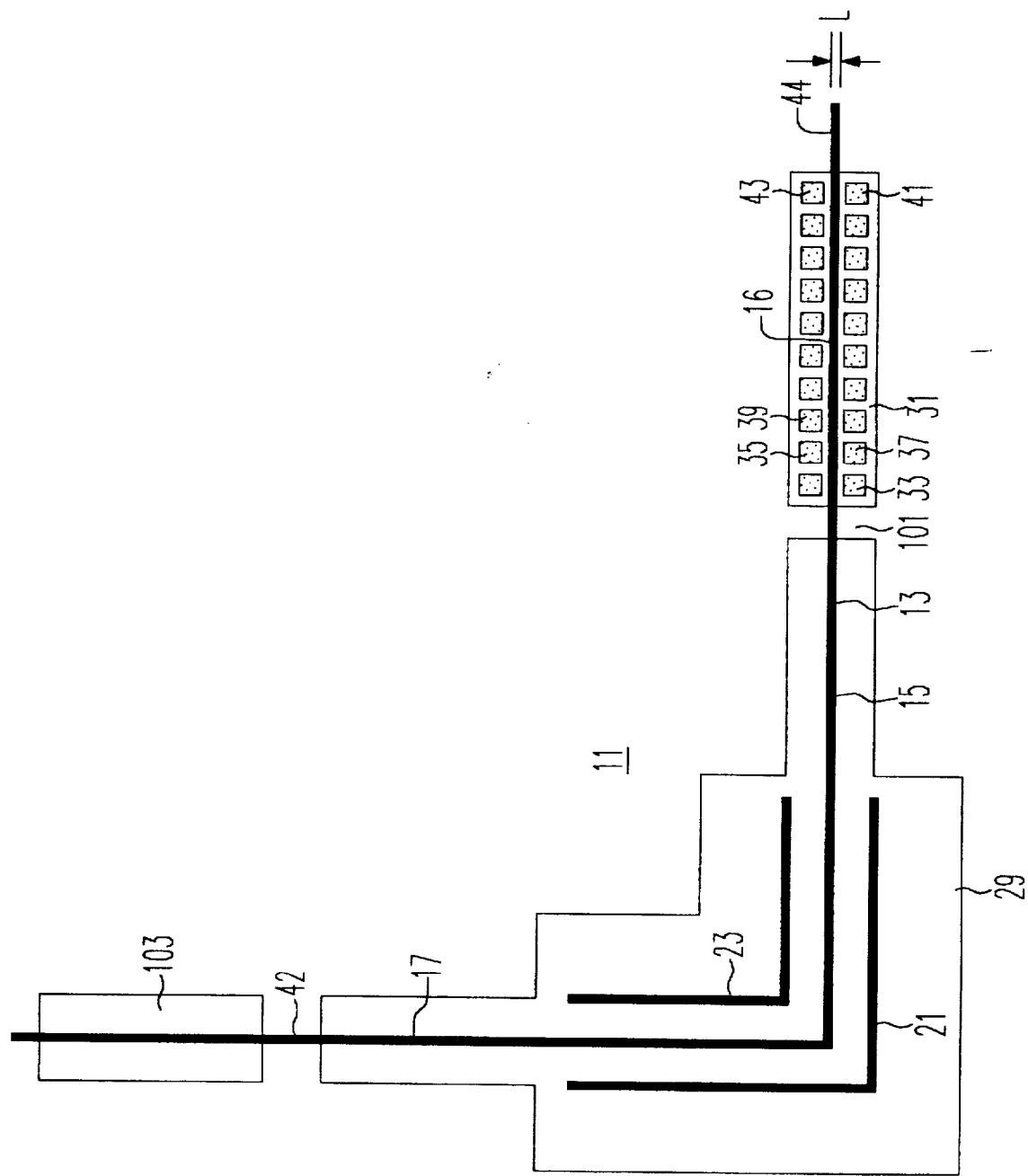
FIG. 1 is a diagram useful in understanding an illustrative embodiment of the present invention.

FIG. 1 is a diagram which represents a top-down view of a gate level linewidth control feature which may be formed in the streets between individual integrated circuits. The gate level linewidth control features shown as solid black lines and denoted generally by reference numeral 13 are formed upon a silicon substrate which is covered by silicon dioxide 11. Silicon dioxide 11 is, typically, formed during the field oxide formation process and has, therefore, a thickness comparable to a typical field oxide.

Linewidth control feature 13 is formed from polysilicon during the gate formation process. Dimension "L" is desirably the same as gate length of gates formed within individual integrated circuits.

Linewidth control feature 13 has two generally perpendicular arms 15 and 17. Optical, SEM or other linewidth measurement of arms 15 and 17 and the notation of any differences in linewidth provides an indication of the existence of imaging aberrations such as astigmatism during the lithographic gate formation process. L-shaped features 21 and 23 (also having a design width L) are formed adjacent to arms 17 and 15 and parallel therewith. Features 21 and 23 assist in calibration of magnification of the linewidth measurement system. Observation of features 21 and 23 together with arms 17 and 15 may provide an indication of the existence of proximity effects.

Linewidth control feature 13 also functions, however, as a transistor whose electrical properties may be measured and correlated with optical measurements. Thin oxide ("thinox") region 29 surrounds and extends under a major portion of arms 15 and 17. In addition, thin oxide region 31 surrounds and extends under portion 16 of arm 15. Portions 42 and 44 of linewidth control feature 13 may extend beyond thinox regions 29 and 31. Field oxide 101 separates thin oxide region 29 and 31. Thin oxide region 31 is implanted during the source and drain formation process. Contacts, indicated illustratively by openings 33, 35, 37, 39, 41 and 43 are opened to the source and drain regions beneath thin oxide 31. Thus, it can be appreciated that a transistor has been fabricated utilizing extension 16 of arm 15 of linewidth control feature 13 when appropriate contacts to bond pads are created for extension 16 and source/drain contacts 33, 35, 37, 39, 41 and 43. Electrical measurements of the gate length of the transistor having gate 16 may then be performed and correlated with optical or SEM measurements of the dimension L of arm 15. Similarly, if desired, source and drain regions may be created adjacent to arm 17 (in thinox region 103) and optical characteristics correlated with electrical characteristics, thereby providing information about feature size control in orthogonal directions.

Production processes may be improved by creating linewidth control features 13 having integral transistors on a variety of different wafers. Each linewidth control feature may be measured by optical or SEM means and then electrically measured. A correlation may be established between optical and electrical measurements. Subsequently produced wafers may be only optically measured and, if desired, their electrical characteristics inferred from previously obtained correlations. The present invention provides a method for establishing a tighter correlation between optical and electrical measurements of gate length.

Previous practice permitted the formation of the optically measured feature (such as 15) at a substantial distance from and separated from the electrically measured feature (e.g., 16). The present invention places the optically measured feature and the electrically measured feature in very close proximity. Thus, the optically measured feature and the electrically measured feature are formed at the same time and in virtually identical resist-etching environments on the wafer. There may be minute variations in the resist deposition and etching environment (e.g., processing environment) across the wafer surface. Thus, features which are formed at locations on the wafer which are too far apart may have different widths due to differences in the processing environment.

One might be tempted to utilize the same feature for both optical (or SEM) and electrical measurements. However, SEM measurements, even low voltage SEM measurements, tend to create stored charge in gate oxides, thereby distorting subsequent electrical measurements. Thus, separate features are required.

Furthermore, the accuracy of the optical (or SEM) measurement is enhanced by the presence of additional optical features (e.g., 21, 23) spaced a predetermined distance from the principal, somewhat longer feature (e.g., 13). The presence of the additional optical features permits a pitch measurement to be made optically (or by SEM). The pitch measurement, which can be made more accurately than a linewidth measurement, may be used to calibrate subsequent linewidth measurements. However, additional optical features (e.g., 21, 23) made from gate-level polysilicon stripes cannot be formed a predetermined distance (usually corresponding to the smallest pitch used in the integrated circuits formed on the wafer) from the principal feature (e.g., 15, 17) if contact windows for electrical measurement are formed adjacent the principal feature. Thus, separate features for optical (or SEM) measurement and electrical measurement are required.

The presence of field oxide 101 which separates thinox regions 29 and 31 insures that electrical measurements made over thinox 31 are not distorted by the presence of thinox 29 and that these electrical measurements are representative of a typical transistor in an integrated circuit on the wafer.

Formation of regions 11 and 101 takes place concurrently with field oxide formation in the integrated circuits on the wafer. Consequently, these regions may be termed "field oxides." Formation of regions 29, 31 (and 103, if desired) is concurrent with formation of thin oxide ("thinox") (i.e., gate oxide) regions in the integrated circuits on the wafer. Consequently, these regions may be also referred to as thin oxide regions or "thinox" regions. Windows, for example 35, 39, 33, etc. are formed and filled concurrently with windows which are formed and filled in the integrated circuits on the wafer.

What is claimed is:

1. A method of integrated circuit manufacturing including the formation of a plurality of integrated circuits having gates, wherein said gates are separated from each other by streets comprising:

forming at least one linewidth control feature of gate level polysilicon in said streets; said linewidth control feature having first, second and third portions, said first and third portions being formed over a thin oxide region and said second portion being formed over a field oxide;

forming a source and a drain adjacent said third portion of said linewidth control feature;

forming contacts to said third portion of said linewidth control feature and to said source and said drain, thereby forming a test transistor in said streets.

2. The method of claim 1 further including the steps of measuring said first portion of said linewidth control feature by optical or SEM means; and electrically measuring the gate length of said transistor.

* * * * *